(12) United States Patent
Murata et al.

(10) Patent No.: US 12,410,291 B2
(45) Date of Patent: Sep. 9, 2025

(54) BARRIER FILM, WAVELENGTH CONVERSION SHEET, AND WAVELENGTH CONVERSION SHEET PRODUCTION METHOD

(71) Applicants: TOPPAN PRINTING CO., LTD., Tokyo (JP); ARAKAWA CHEMICAL INDUSTRIES, LTD., Osaka (JP)

(72) Inventors: Koji Murata, Tokyo (JP); Masayoshi Suzuta, Tokyo (JP); Akihiro Yamazaki, Osaka (JP); Toru Higashimoto, Osaka (JP)

(73) Assignees: TOPPAN PRINTING CO., LTD., Tokyo (JP); ARAKAWA CHEMICAL INDUSTRIES, LTD., Osaka (JP)

( * ) Notice: Subject to any disclaimer, the term of this patent is extended or adjusted under 35 U.S.C. 154(b) by 1151 days.

(21) Appl. No.: 17/264,104

(22) PCT Filed: Jun. 3, 2019

(86) PCT No.: PCT/JP2019/022035
§ 371 (c)(1),
(2) Date: Jan. 28, 2021

(87) PCT Pub. No.: WO2020/026581
PCT Pub. Date: Feb. 6, 2020

(65) Prior Publication Data
US 2021/0301097 A1    Sep. 30, 2021

(30) Foreign Application Priority Data
Jul. 30, 2018 (JP) ................................. 2018-142108

(51) Int. Cl.
*C08J 7/043* (2020.01)
*B05D 3/06* (2006.01)
(Continued)

(52) U.S. Cl.
CPC .............. *C08J 7/043* (2020.01); *B05D 3/061* (2013.01); *B05D 5/06* (2013.01); *B05D 7/546* (2013.01);
(Continued)

(58) Field of Classification Search
CPC .......... C09D 175/04; C09D 133/04–16; C08G 18/671–673; H01L 33/501; H10H 20/8511; H10H 20/8512
See application file for complete search history.

(56) References Cited

U.S. PATENT DOCUMENTS

2018/0179411 A1 * 6/2018 Naik .................... C09D 133/14

FOREIGN PATENT DOCUMENTS

EP    0353677 A2 *   2/1990
JP    2002-019033 A   1/2002
(Continued)

OTHER PUBLICATIONS

Partial machine translation of JP 2012-171291 (Year: 2012).*
(Continued)

*Primary Examiner* — Kregg T Brooks
(74) *Attorney, Agent, or Firm* — STAAS & HALSEY LLP

(57) ABSTRACT

Provided is a barrier film including a gas barrier film and a primer layer disposed on one outermost surface of the barrier film and made of a cured product formed by using a composition for forming a primer layer, the composition containing a resin having a reactive carbon-carbon double bond, a resin not having a reactive carbon-carbon double bond but having a primary hydroxyl group, and a polyisocyanate compound, the primer layer having a surface wetting index of 40 dyn/cm or more.

6 Claims, 5 Drawing Sheets

(51) Int. Cl.
   *B05D 5/06*        (2006.01)
   *B05D 7/00*        (2006.01)
   *B82Y 20/00*       (2011.01)
   *B82Y 40/00*       (2011.01)
   *C08J 7/04*        (2020.01)
   *C08J 7/048*       (2020.01)
   *C09D 175/04*      (2006.01)
   *C09K 11/56*       (2006.01)
   *C09K 11/88*       (2006.01)
   *H10H 20/851*      (2025.01)

(52) U.S. Cl.
   CPC .............. *C08J 7/042* (2013.01); *C08J 7/048* (2020.01); *C09D 175/04* (2013.01); *C09K 11/565* (2013.01); *C09K 11/883* (2013.01); *H10H 20/8511* (2025.01); *H10H 20/8514* (2025.01); *B82Y 20/00* (2013.01); *B82Y 40/00* (2013.01); *C08J 2467/02* (2013.01); *C08J 2475/06* (2013.01)

(56) References Cited

FOREIGN PATENT DOCUMENTS

| | | | |
|---|---|---|---|
| JP | 2012171291 A | * | 9/2012 |
| JP | 2016-175223 A | | 10/2016 |
| JP | 2017-182041 A | | 10/2017 |
| JP | 2018-022092 A | | 2/2018 |
| KR | 10-2003-0036600 | | 5/2003 |
| WO | WO 02/04204 A1 | | 1/2002 |
| WO | WO 2014/113562 A1 | | 7/2014 |
| WO | WO 2017/026349 A1 | | 2/2017 |

OTHER PUBLICATIONS

Partial machine translation of JP 2017-182041 (Year: 2017).*
Partial machine translation of JP 2018-022092 (Year: 2018).*
International Search Report (Form PCT/ISA/210) mailed Aug. 27, 2019 in corresponding International Patent Application No. PCT/JP2019/022035 (3 pages) (2 pages English Translation).
Written Opinion of the International Searching Authority (Form PCT/ISA/237); mailed Aug. 27, 2019 in corresponding International Patent Application No. PCT/JP2019/022035 (6 pages).
Notification of Transmittal of Translation of the International Preliminary Report on Patentability and International Preliminary Report on Patentability (Forms PCT/IB/338, PCT/IB/373); issued Feb. 11, 2021 in corresponding International Patent Application No. PCT/JP2019/022035 (2 pages).
Office Action dated Dec. 26, 2022 in counterpart Korean Patent Application No. 10-2021-7002854 (6 pages).

* cited by examiner

BARRIER FILM, WAVELENGTH CONVERSION SHEET, AND WAVELENGTH CONVERSION SHEET PRODUCTION METHOD

CROSS REFERENCE TO RELATED APPLICATIONS

This application is a U.S. National Stage Application under 35 U.S.C. § 371 of PCT International Patent Application No. PCT/JP2019/022035, filed on Jun. 3, 2019, which claims the foreign priority benefit under 35 U.S.C. § 119 of Japanese Patent Application No. 2018-142108, filed on Jul. 30, 2018, in the Japanese Patent Office, the contents of both of which International Patent Application and the Japanese Application are incorporated by reference herein in their entirety.

TECHNICAL FIELD

The present disclosure relates to a barrier film, a wavelength conversion sheet, and a method for producing a wavelength conversion sheet.

BACKGROUND ART

A wavelength conversion sheet using a phosphor such as quantum dots is high in luminance and color reproducibility and thus has been expected to be adopted for displays. However, the phosphor such as quantum dots deteriorates upon contact with oxygen or water vapor. Therefore, the wavelength conversion sheet has often adopted such a structure that a barrier film in which a gas barrier layer is formed on a polymer film is disposed on one or both surfaces of a phosphor layer containing a phosphor.

For example, in Patent Literature 1, it is stated that a barrier film is laminated to both surfaces of a phosphor layer in which quantum dots are dispersed in an acrylic resin and an epoxy resin, and thereby oxygen and the like are prevented from being infiltrated into the phosphor layer.

CITATION LIST

Patent Literature

Patent Literature 1: International Publication WO 2014/113562

SUMMARY OF INVENTION

Technical Problem

However, the phosphor layer in which quantum dots as an inorganic material are dispersed as described in Patent Literature 1 is poor in adhesion to the barrier film, and there is a concern that peeling occurs between the phosphor layer and the barrier film. Furthermore, since the peeling of the barrier film gives a great influence on the lowering of performance not only in a quantum dot film as described in Patent Literature 1 but also in an optical laminate having a structure in which a phosphor layer and a barrier film are stacked, it has been required to improve adhesion between the barrier film and the phosphor layer.

Further, in a case where the optical laminate is left under a high-temperature high-humidity environment for a long time, there are problems in that peeling between the phosphor layer and the barrier film is further likely to occur, this peeling causes the infiltration of moisture and oxygen from a sheet edge, and thus light-emitting properties of the phosphor layer are likely to deteriorate. Therefore, even in a case where the optical laminate is left under a high-temperature high-humidity environment for a long time, the optical laminate is required to be capable of maintaining superior adhesion between the phosphor layer and the barrier film.

The present disclosure has been made in consideration of the problems involved in the prior art described above, and an object thereof is to provide a barrier film including a primer layer in which superior adhesion with respect to a phosphor layer is obtained and superior adhesion can be maintained even in a case where the barrier film is left under a high-temperature high-humidity environment for a long time, a wavelength conversion sheet including the barrier film, and a method for producing a wavelength conversion sheet.

Solution to Problem

In order to achieve the above-described object, the present disclosure provides a barrier film including a gas barrier film and a primer layer disposed on one outermost surface of the barrier film and made of a cured product formed by using a composition for forming a primer layer, the composition containing a resin having a reactive carbon-carbon double bond, a resin not having a reactive carbon-carbon double bond but having a primary hydroxyl group, and a polyisocyanate compound, the primer layer having a surface wetting index of 40 dyn/cm or more.

According to the above-described barrier film, when the primer layer is formed by using the composition for forming a primer layer containing two types of resins having the specific structures described above and a polyisocyanate compound and the surface wetting index thereof is 40 dyn/cm or more, superior adhesion with respect to the phosphor layer is obtained through the primer layer, and even in a case where the barrier film is left under a high-temperature high-humidity environment for a long time, superior adhesion can be maintained. The present inventors have considered that the reasons for obtaining superior adhesion described above and capable of maintaining superior adhesion even after the barrier film is left under a high-temperature high-humidity environment are as follows. That is, when the above-described wetting index is 40 dyn/cm or more, wettability between the primer layer and the phosphor layer becomes satisfactory, and superior adhesion between the primer layer and the phosphor layer is obtained. Furthermore, when the composition for forming a primer layer contains two types of resins having the specific structures described above and a polyisocyanate compound, a dense cross-linked structure is formed in the primer layer, superior adhesion between the primer layer and the phosphor layer is obtained, and even in a case where the barrier film is left under a high-temperature high-humidity environment for a long time, the cross-linked structure is maintained and superior adhesion is maintained. Therefore, even in a case where the barrier film is left under a high-temperature high-humidity environment for a long time, peeling between the phosphor layer and the barrier film hardly occurs and deterioration of light-emitting properties of the phosphor layer due to the infiltration of moisture and oxygen from the sheet edge can be prevented. Further, when a dense cross-linked structure is formed in the primer layer, the infiltration of moisture and oxygen from the sheet edge through the primer layer itself can be suppressed, and deterioration of light-emitting properties of the phosphor layer can be prevented. In addition, when the composition for forming a primer layer contains the resin not having a reactive carbon-carbon double bond but having a primary hydroxyl group, the hydroxyl group is contained in the primer layer, and the presence of this hydroxyl group makes adhesion between the primer layer and the phosphor layer more improve particularly in a case where the phosphor layer is formed by using an epoxy resin or a resin containing polyisocyanate. Furthermore, when the composition for forming a primer layer contains the resin having a reactive carbon-carbon double bond, the reactive carbon-carbon double bond is contained in the primer layer, and the presence of this reactive carbon-carbon double bond makes adhesion between the primer layer and the phosphor layer more improve particularly in a case where the phosphor layer is formed by using a UV curable resin.

In the above-described barrier film, an NCO/OH ratio of the composition for forming a primer layer is preferably 0.1 to 0.6. When the NCO/OH ratio is 0.1 or more, a sufficient cross-linked structure is formed in the primer layer, a decrease in adhesion between the phosphor layer and the barrier film in a case where the barrier film is left under a high-temperature high-humidity environment for a long time is more sufficiently suppressed. On the other hand, when the NCO/OH ratio is 0.6 or less, the hydroxyl group sufficiently remains in the primer layer, and thus adhesion between the primer layer and the phosphor layer is more improved particularly in a case where the phosphor layer is formed by using an epoxy resin or a resin containing polyisocyanate.

In the above-described barrier film, a (meth)acrylic equivalent of the whole resin components contained in the composition for forming a primer layer is preferably 270 to 800 g/eq. The reactive carbon-carbon double bond exhibits strong adhesion with respect to the phosphor layer to be UV-cured by being incorporated into a curing system of the phosphor layer at the time of UV curing; on the other hand, when reactive carbon-carbon double bond components are large, the wettability of the primer layer tends to decrease. Therefore, it is considered that there is an optimal range in the abundance of the reactive carbon-carbon double bond. Furthermore, this reactive carbon-carbon double bond is preferably a carbon-carbon double bond derived from a (meth)acryloyl group. Further, when the (meth)acrylic equivalent of the whole resin components excluding the polyisocyanate compound is within the above-described range, particularly satisfactory adhesion between the primer layer and the phosphor layer is obtained. When the (meth) acrylic equivalent is 800 g/eq or less, the reactive carbon-carbon double bond sufficiently exists, and particularly, superior adhesion between the phosphor layer using a UV curable resin and the primer layer is obtained. On the other hand, when the (meth)acrylic equivalent is 270 g/eq or more, wettability of the primer layer is improved, and superior adhesion to the phosphor layer is obtained.

In the above-described barrier film, a hydroxyl value of the whole resin components contained in the composition for forming a primer layer is preferably 150 to 230 mgKOH/g. When the hydroxyl value is within the above-described range, particularly satisfactory adhesion between the primer layer and the phosphor layer is obtained. When the hydroxyl value is 150 mgKOH/g or more, cross-linkage by the polyisocyanate compound is sufficiently performed at the time of forming the primer layer, and even in a case where the barrier film is left under a high-temperature high-humidity environment for a long time, the cross-linked structure is maintained, and superior adhesion between the phosphor layer and the primer layer is more sufficiently maintained. On the other hand, when the hydroxyl value is 230 mgKOH/g or less, it is possible to prevent that the hydroxyl group excessively remains in the primer layer so that water vapor is likely to be transmitted, and deterioration of light-emitting properties of the phosphor layer in a case where the barrier film is left under a high-temperature high-humidity environment for a long time can be prevented.

The present disclosure also provides a wavelength conversion sheet including a phosphor layer containing a phosphor and a cured product of a curable resin and the above-described barrier film of the present disclosure stacked on at least one surface of the phosphor layer, in which the barrier film includes the primer layer on an outermost surface of the phosphor layer side.

According to the above-described wavelength conversion sheet, when the barrier film and the phosphor layer are stacked through the primer layer, superior adhesion between the barrier film and the phosphor layer can be obtained, and even in a case where the barrier film is left under a high-temperature high-humidity environment for a long time, superior adhesion can be maintained.

The present disclosure further provides a method for producing a wavelength conversion sheet, the method including a step of coating a composition for forming a phosphor layer containing a phosphor and a curable resin on a primer layer of a barrier film to form a coating film, the barrier film including a gas barrier film and the primer layer disposed on one outermost surface of the barrier film and made of a cured product formed by using a composition for forming a primer layer, the composition containing a resin having a reactive carbon-carbon double bond, a resin not having a reactive carbon-carbon double bond but having a primary hydroxyl group, and a polyisocyanate compound, the primer layer having a surface wetting index of 40 dyn/cm or more, and a step of curing the curable resin in the coating film to form a phosphor layer.

In the wavelength conversion sheet according to the above-described method, when the barrier film and the phosphor layer are stacked through the primer layer, superior adhesion between the barrier film and the phosphor layer can be obtained, and even in a case where the barrier film is left under a high-temperature high-humidity environment for a long time, superior adhesion can be maintained.

Advantageous Effects of Invention

According to the present disclosure, it is possible to provide a barrier film including a primer layer in which superior adhesion with respect to a phosphor layer is obtained and superior adhesion even in a case where the barrier film is left under a high-temperature high-humidity environment for a long time can be maintained, a wavelength conversion sheet including the barrier film, and a method for producing a wavelength conversion sheet.

DESCRIPTION OF EMBODIMENTS

Figure 1:
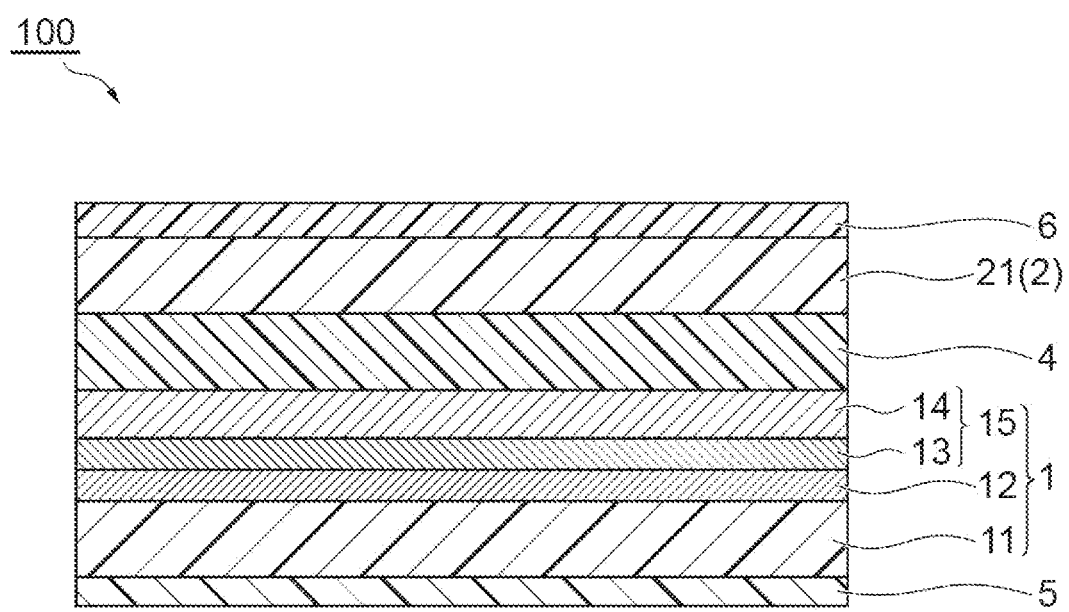
FIG. 1 is a schematic cross-sectional view illustrating an embodiment of a barrier film of the present disclosure.

Hereinafter, preferred embodiments of the present disclosure will be described in detail occasionally with reference to the drawings. Incidentally, in the drawings, the same or corresponding parts are designated by the same reference signs, and redundant description will be omitted. Furthermore, the dimensional ratios in the drawings are not limited to as ratios illustrated in the drawings.

[Composition for Forming Primer Layer]

A composition for forming a primer layer used for forming a primer layer in a barrier film of the present disclosure contains a resin having a reactive carbon-carbon double bond, a resin not having a reactive carbon-carbon double bond but having a primary hydroxyl group, and a polyisocyanate compound, and a surface wetting index of the primer layer formed by using the composition for forming a primer layer is 40 dyn/cm or more. This composition for forming a primer layer can be a composition for forming a primer layer used for forming a primer layer adjacent to the phosphor layer of the optical laminate. Hereinafter, respective components will be described in detail.

(Resin Having Reactive Carbon-Carbon Double Bond)

The reactive carbon-carbon double bond refers to a carbon-carbon double bond that is radically polymerizable or cationically polymerizable. The resin having a reactive carbon-carbon double bond can be a resin containing a group having a reactive carbon-carbon double bond. The group having a reactive carbon-carbon double bond is preferably a group having an ethylenical unsaturated double bond, and for example, is more preferably a styryl group, a (meth)acryloyl group, or the like, further preferably a (meth)acryloyl group, and particularly preferably an acryloyl group. When the group having a reactive carbon-carbon double bond is an acryloyl group, reactivity in the primer layer and reactivity with the phosphor layer are improved, and more superior adhesion tends to be obtained.

Examples of the resin having a reactive carbon-carbon double bond include polymers having a reactive carbon-carbon double bond in the molecule. As above-described polymer, for example, a polymer obtained by introducing a reactive carbon-carbon double bond into the side chain of a polymer, which is obtained by polymerizing one or two or more types of polymerizable monomers, and the like are exemplified, but the polymer is not limited thereto. The resin having a reactive carbon-carbon double bond can be used singly or in combination of two or more types thereof.

The weight average molecular weight of the resin having a reactive carbon-carbon double bond is preferably 300 to 100,000, more preferably 500 to 50,000, and particularly preferably 1,000 to 30,000. When the weight average molecular weight is 300 or more, there is a tendency that film formability becomes satisfactory, and when the weight average molecular weight is 100,000 or less, there is a tendency that coating runnability becomes satisfactory. Incidentally, in the present specification, the weight average molecular weight is obtained as measured by gel permeation chromatography (GPC) and converted from a calibration curve using standard polystyrene.

The (meth)acrylic equivalent of the resin having a reactive carbon-carbon double bond is preferably 214 to 360 g/eq and more preferably 214 to 290 g/eq. When the (meth)acrylic equivalent of the resin having a reactive carbon-carbon double bond is within the above-described range, the (meth)acrylic equivalent of the whole resin components is easily adjusted within a preferred range described below, and superior adhesion between the phosphor layer and the primer layer is easily obtained.

The resin having a reactive carbon-carbon double bond may have a hydroxyl group. The hydroxyl group may be a primary hydroxyl group or a secondary hydroxyl group. In a case where the resin having a reactive carbon-carbon double bond has a hydroxyl group, the hydroxyl value thereof is preferably 100 to 300 mgKOH/g and more preferably 130 to 270 mgKOH/g. When the hydroxyl value of the resin having a reactive carbon-carbon double bond is within the above-described range, the hydroxyl value of the whole resin components is easily adjusted within a preferable range described below, and even in a case where the barrier film is left under a high-temperature high-humidity environment for a long time, superior adhesion between the phosphor layer and the primer layer is easily maintained and deterioration of light-emitting properties of the phosphor layer is easily prevented.

Examples of the resin not having a reactive carbon-carbon double bond but having a primary hydroxyl group include polymers not having a reactive carbon-carbon double bond in the molecule but having a primary hydroxyl group. Examples of the polymers include polymers using monomers, as monomer components, having a primary hydroxyl group and (meth)acryloyl groups such as hydroxyalkyl (meth)acrylate and pentaerythritol triacrylate, and the polymers are limited thereto. The resin not having a reactive carbon-carbon double bond but having a primary hydroxyl group can be used singly or in combination of two or more types thereof.

The weight average molecular weight of the resin not having a reactive carbon-carbon double bond but having a primary hydroxyl group is preferably 300 to 100,000, more preferably 500 to 50,000, and particularly preferably 1,000 to 30,000. When the weight average molecular weight is 300 or more, there is a tendency that film formability becomes satisfactory, and when the weight average molecular weight is 100,000 or less, there is a tendency that coating runnability becomes satisfactory.

The hydroxyl value of the resin not having a reactive carbon-carbon double bond but having a primary hydroxyl group is preferably 10 to 150 mgKOH/g and more preferably 30 to 100 mgKOH/g. When the hydroxyl value of the resin not having a reactive carbon-carbon double bond but having a primary hydroxyl group is within the above-described range, the hydroxyl value of the whole resin components is easily adjusted within a preferable range described below, and even in a case where the barrier film is left under a high-temperature high-humidity environment for a long time, superior adhesion between the phosphor layer and the primer layer is easily maintained and deterioration of light-emitting properties of the phosphor layer is easily prevented.

In the composition for forming a primer layer, the mass ratio of contents of the resin having a reactive carbon-carbon double bond and the resin not having a reactive carbon-carbon double bond but having a primary hydroxyl group (the content of the resin having a reactive carbon-carbon double bond/the content of the resin not having a reactive carbon-carbon double bond but having a primary hydroxyl group) is preferably 0.05 to 8.0, more preferably 0.1 to 7.0, and further preferably 0.3 to 6.0. When this mass ratio is 0.05 or more, particularly, there is a tendency that adhesion between the phosphor layer using a UV curable resin and the primer layer becomes satisfactory, and when the mass ratio is 8.0 or less, there is a tendency that film formability becomes satisfactory.

The (meth)acrylic equivalent of the whole resin components in the composition for forming a primer layer is preferably 200 to 1000 g/eq, more preferably 250 to 900 g/eq, further preferably 270 to 800 g/eq, and particularly preferably 280 to 500 g/eq. When the (meth)acrylic equivalent is 1000 g/eq or less, the reactive carbon-carbon double bond sufficiently exists in the resin component, and particularly, superior adhesion between the phosphor layer using a UV curable resin and the primer layer is obtained. On the other hand, when the (meth)acrylic equivalent is 200 g/eq or more, particularly, 270 g/eq or more, wettability of the primer layer is improved, and superior adhesion to the phosphor layer is obtained. Incidentally, in the present specification, the resin components mean the whole resins contained in the composition for forming a primer layer, and are components including at least a resin having a reactive carbon-carbon double bond and a resin not having a reactive carbon-carbon double bond but having a primary hydroxyl group. The polyisocyanate compound and other components other than the resins, such as additives described below are not included in the resin components. Furthermore, in the present specification, the (meth)acrylic equivalent of the whole resin components can be obtained, for example, by calculation from the (meth)acrylic equivalent of the resin having a reactive carbon-carbon double bond and the ratio of the resin having a reactive carbon-carbon double bond to the content of the whole resin components. Alternatively, the (meth)acrylic equivalent of the whole resin components can also be obtained from comparison with the calibration curve of a substance whose concentration is already known, according to infrared spectroscopy or Raman spectroscopy.

The hydroxyl value of the whole resin components in the composition for forming a primer layer is preferably 100 to 300 mgKOH/g, more preferably 120 to 250 mgKOH/g, further preferably 150 to 230 mgKOH/g, and particularly preferably 170 to 220 mgKOH/g. When the hydroxyl value is 100 mgKOH/g or more, cross-linkage by the polyisocyanate compound is sufficiently performed at the time of forming the primer layer, and even in a case where the barrier film is left under a high-temperature high-humidity environment for a long time, the cross-linked structure is maintained, and superior adhesion between the phosphor layer and the primer layer is more sufficiently maintained. On the other hand, when the hydroxyl value is 300 mgKOH/g or less, it is possible to prevent that the hydroxyl group excessively remains in the primer layer so that water vapor is likely to be transmitted, and deterioration of light-emitting properties of the phosphor layer in a case where the barrier film is left under a high-temperature high-humidity environment for a long time can be prevented. Incidentally, in the present specification, the hydroxyl value of the whole resin components can be obtained, for example, by calculation from the hydroxyl value of the resin having a reactive carbon-carbon double bond, the hydroxyl value of the resin not having a reactive carbon-carbon double bond but having a primary hydroxyl group, and the ratios of these resins to the content of the whole resin components. Alternatively, the hydroxyl value of the whole resin components can also be obtained from comparison with the calibration curve of a substance whose concentration is already known, according to infrared spectroscopy or Raman spectroscopy.

Examples of the polyisocyanate compound include tolylenediisocyanate, diphenylmethane diisocyanate, hexamethylene diisocyanate, isophorone diisocyanate, xylylene diisocyanate, and those obtained by using these materials as raw materials. The polyisocyanate compound may be a prepolymer obtained by reacting the aforementioned polyisocyanate compounds with each other or a prepolymer obtained by reacting the aforementioned polyisocyanate compound with alcohol. The polyisocyanate compound may be a polyisocyanate compound of an isocyanurate type, a biuret type, an adduct type, a bifunctional type (one which is obtained by mixing two types of polyisocyanate compounds), or the like. Of these, from the viewpoint of adhesion, isocyanurate type and biuret type polyisocyanate compounds are preferred. The polyisocyanate compound can be used singly or in combination of two or more types thereof.

The content of the polyisocyanate compound in the composition for forming a primer layer is preferably such an amount that the NCO/OH ratio (molar ratio) in the composition for forming a primer layer becomes 0.05 to 1.0, more preferably such an amount that the NCO/OH ratio becomes 0.1 to 0.6, further preferably such an amount that the NCO/OH ratio becomes 0.15 to 0.55, and particularly preferably such an amount that the NCO/OH ratio becomes 0.2 to 0.5. When the NCO/OH ratio is 0.05 or more, a sufficient cross-linked structure is formed in a primer layer to be obtained, a decrease in adhesion between the phosphor layer and the barrier film in a case where the barrier film is left under a high-temperature high-humidity environment for a long time is more sufficiently suppressed. On the other hand, when the NCO/OH ratio is 1.0 or less, the hydroxyl group sufficiently remains in the primer layer, and thus adhesion between the primer layer and the phosphor layer is more improved particularly in a case where the phosphor layer is formed by using an epoxy resin or a resin containing polyisocyanate. Incidentally, in the present specification, the NCO/OH ratio of the composition for forming a primer layer can be obtained from comparison with the calibration curve of a substance whose concentration is already known, according to infrared spectroscopy or Raman spectroscopy.

The composition for forming a primer layer may contain other components (additives) other than the resin having a reactive carbon-carbon double bond, the resin not having a reactive carbon-carbon double bond but having a primary hydroxyl group, and the polyisocyanate compound mentioned above. Examples of the additives include a slipping agent, a surfactant, a solvent, a defoaming agent, and an antistatic agent. As the solvent, for example, methyl ethyl ketone, methyl isobutyl ketone, cyclohexanone, ethyl acetate, butyl acetate, methanol, ethanol, isopropyl alcohol, butanol, and the like can be used.

In a case where the phosphor layer uses a UV curable resin, the composition for forming a primer layer preferably contains a photopolymerization initiator. When the photopolymerization initiator is contained, adhesion between the primer layer and the phosphor layer when the phosphor layer is UV-cured is more improved. In a case where the composition for forming a primer layer contains a photopolymerization initiator, the content thereof is preferably 1 to 30 parts by mass and more preferably 2 to 15 parts by mass with respect to 100 parts by mass of the resin components in the composition for forming a primer layer. When this content is 1 part by mass or more, an adhesion improvement effect is sufficiently obtained, and when the content is 30 parts by mass or less, it is possible to prevent that the primer layer becomes brittle so as to decrease an adhesion force.

A thermosetting catalyst promoting urethanization may be added to the composition for forming a primer layer in order to promote heat curing of the primer layer. As the thermosetting catalyst, catalysts of tin-based, zirconium-based, titanium-based, and the like can be used.

As for the composition for forming a primer layer, a surface wetting index of the primer layer formed by using this composition is 40 dyn/cm or more. The wetting index is more preferably 42 dyn/cm or more. When the wetting index is 40 dyn/cm or more, wettability between a primer layer to be obtained and the phosphor layer becomes satisfactory, and superior adhesion between the primer layer and the phosphor layer is obtained. The upper limit value of the wetting index is not particularly limited, and may be 50 dyn/cm or less. The wetting index can be measured, for example, by using a wetting reagent. The wetting index can be measured by using a primer layer which is obtained in such a manner that a coating film is formed by using the composition for forming a primer layer and the coating film is cured. The curing conditions of the primer layer are not particularly limited as long as they are conditions under which curing can be sufficiently performed, and curing can be performed, for example, under conditions of 60° C. to 150° C. and 15 to 300 seconds. Furthermore, in order to more sufficiently cure the primer layer, the aging treatment may be performed at 40° C. to 80° C. for 1 to 7 days.

[Barrier Film]

The barrier film of the present disclosure includes a gas barrier film and a primer layer disposed on one outermost surface of the barrier film and made of the cured product of the composition for forming a primer layer described above. Hereinafter, preferred embodiments of the barrier film of the present disclosure will be described while using the drawings.

FIGS. 1 to 4 are schematic cross-sectional views each illustrating an embodiment of a barrier film of the present disclosure. A barrier film 100 illustrated in FIG. 1 includes a first film 1 that is a gas barrier film, a second film 2, an adhesion layer 4, a primer layer 5, and a mat layer 6. Herein, the first film 1 includes a first substrate 11, an anchor coat layer 12, and a barrier layer 15 including an inorganic thin film layer 13 and a gas barrier coating layer 14. The second film 2 is configured by only a second substrate 21. The first film 1 and the second film 2 are laminated through the adhesion layer 4 such that the gas barrier coating layer 14 and the second substrate 21 face each other. In the barrier film 100, the primer layer 5 is disposed on the surface of the first substrate 11 side of the first film 1 in a state of being in contact with the first substrate 11, and the mat layer 6 is disposed on the surface of the second substrate 21 constituting the second film 2 opposite to the adhesion layer 4 in a state of being in contact with the second substrate 21. When the barrier film 100 having the structure illustrated in FIG. 1 includes the second film 2, gas barrier properties and mechanical strength are improved, and since the second film 2 is configured by only the second substrate 21, as compared with barrier films of FIGS. 3 and 4 described below, simplification of producing processes, cost reduction, and a decrease in thickness can be achieved.

Figure 2:
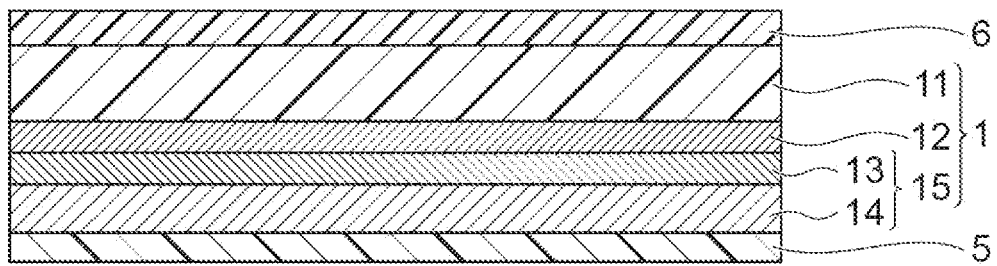
FIG. 2 is a schematic cross-sectional view illustrating an embodiment of a barrier film of the present disclosure.

A barrier film 200 illustrated in FIG. 2 includes a first film 1 that is a gas barrier film, a primer layer 5, and a mat layer 6. Herein, the first film 1 includes a first substrate 11, an anchor coat layer 12, and a barrier layer 15 including an inorganic thin film layer 13 and a gas barrier coating layer 14. In the barrier film 200, the primer layer 5 is disposed on the surface of the gas barrier coating layer 14 side of the first film 1 in a state of being in contact with the gas barrier coating layer 14, and the mat layer 6 is disposed on the surface of the first substrate 11 side of the first film 1 in a state of being in contact with the first substrate 11. Since the barrier film 200 having the structure illustrated in FIG. 2 does not include a second film 2 and an adhesion layer 4, simplification of producing processes, cost reduction, and a decrease in thickness can be achieved.

Figure 3:
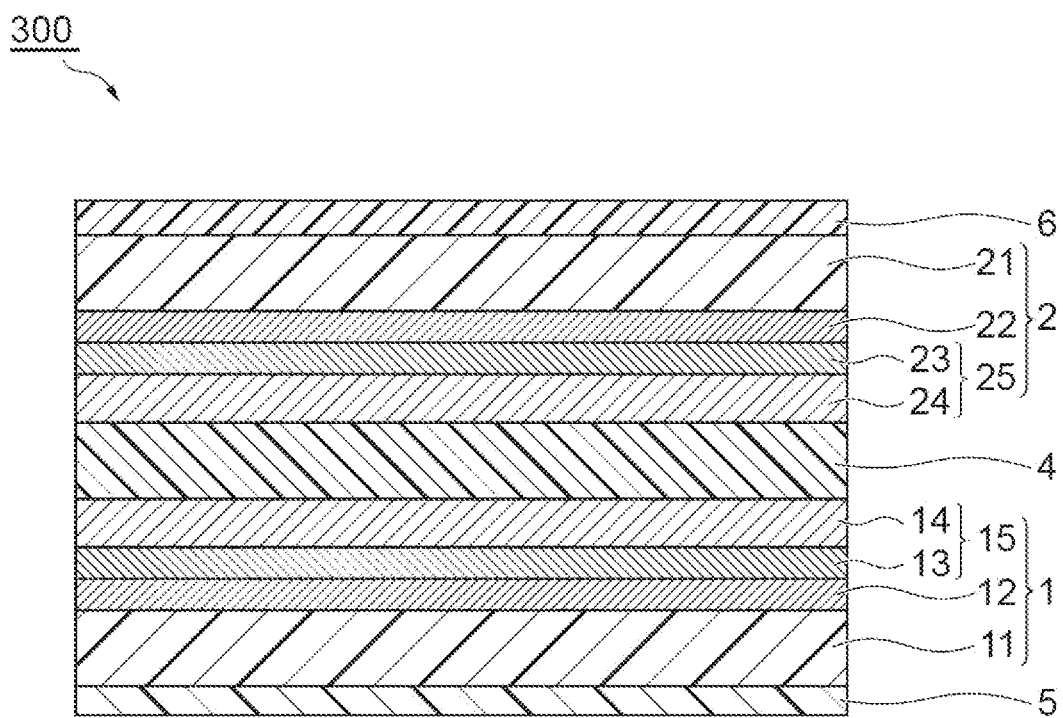
FIG. 3 is a schematic cross-sectional view illustrating an embodiment of a barrier film of the present disclosure.

A barrier film 300 illustrated in FIG. 3 includes a first film 1 that is a gas barrier film, a second film 2 that is a gas barrier film, an adhesion layer 4, a primer layer 5, and a mat layer 6. Herein, the first film 1 includes a first substrate 11, an anchor coat layer 12, and a barrier layer 15 including an inorganic thin film layer 13 and a gas barrier coating layer 14. The second film 2 includes a second substrate 21, an anchor coat layer 22, and a barrier layer 25 including an inorganic thin film layer 23 and a gas barrier coating layer 24. The first film 1 and the second film 2 are laminated through the adhesion layer 4 such that the gas barrier coating layer 14 and the gas barrier coating layer 24 face each other. In the barrier film 300, the primer layer 5 is disposed on the surface of the first substrate 11 side of the first film 1 in a state of being in contact with the first substrate 11, and the mat layer 6 is disposed on the surface of the second substrate 21 side of the second film 2 in a state of being in contact with the second substrate 21. Since the two gas barrier films of the first and second films 1 and 2 are laminated, the barrier film 300 having the structure illustrated in FIG. 3 can more sufficiently suppress transmission of moisture and oxygen. Furthermore, when the barrier layers 15 and 25 are disposed at the inner sides (between the first substrate 11 and the second substrate 21) of the first and second substrates 11 and 21, the barrier layers 15 and 25 are protected and damage on the barrier layers 15 and 25 is suppressed.

Figure 4:
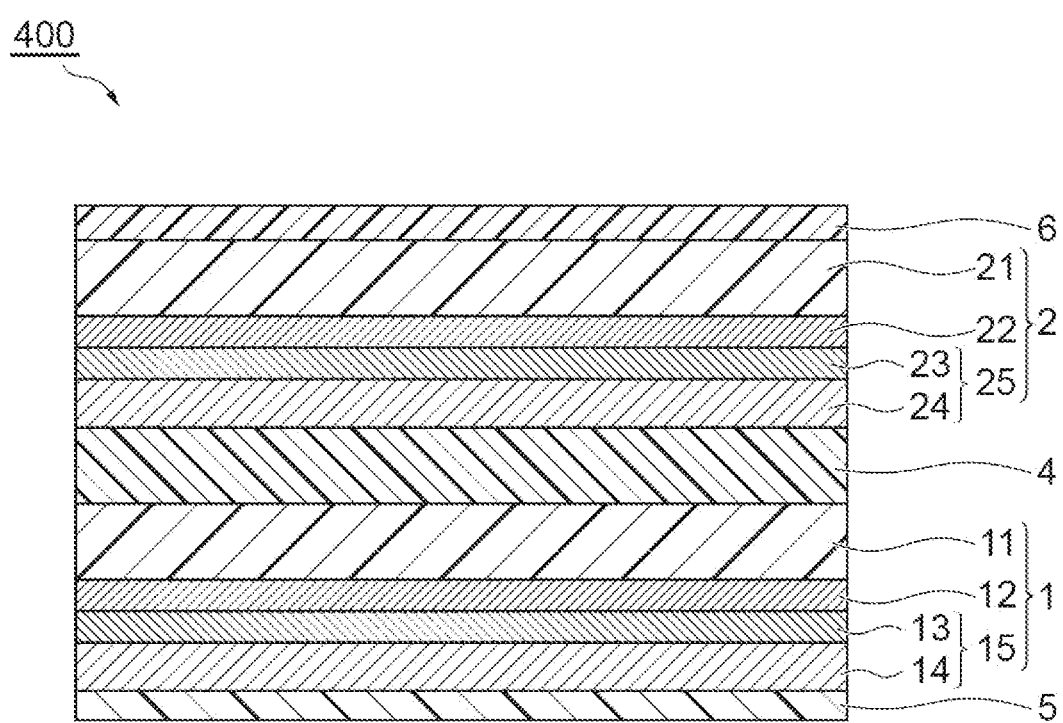
FIG. 4 is a schematic cross-sectional view illustrating an embodiment of a barrier film of the present disclosure.

A barrier film 400 illustrated in FIG. 4 includes a first film 1 that is a gas barrier film, a second film 2 that is a gas barrier film, an adhesion layer 4, a primer layer 5, and a mat layer 6. Herein, the first film 1 includes a first substrate 11, an anchor coat layer 12, and a barrier layer 15 including an inorganic thin film layer 13 and a gas barrier coating layer 14. The second film 2 includes a second substrate 21, an anchor coat layer 22, and a barrier layer 25 including an inorganic thin film layer 23 and a gas barrier coating layer 24. The first film 1 and the second film 2 are laminated through the adhesion layer 4 such that the first substrate 11 and the gas barrier coating layer 24 face each other. In the barrier film 400, the primer layer 5 is disposed on the surface of the gas barrier coating layer 14 side of the first film 1 in a state of being in contact with the gas barrier coating layer 14, and the mat layer 6 is disposed on the surface of the second substrate 21 side of the second film 2 in a state of being in contact with the second substrate 21. Since the two gas barrier films of the first and second films 1 and 2 are laminated, the barrier film 400 having the structure illustrated in FIG. 4 can more sufficiently suppress transmission of moisture and oxygen. Furthermore, when the barrier layer 15 is disposed at the primer layer 5 side, that is, at a position closer to the phosphor layer, the infiltration of moisture and oxygen toward the phosphor layer can be more sufficiently suppressed.

The barrier films 100, 200, 300, and 400 having the configurations mentioned above have satisfactory gas barrier properties, and superior adhesion can be obtained by lamination with the phosphor layer through the primer layer 5. Furthermore, the primer layer 5 is formed by using the aforementioned composition for forming a primer layer and exhibits extremely satisfactory adhesion also with respect to both the first substrate 11 and the gas barrier coating layer 14, and occurrence of peeling in the barrier film is also sufficiently suppressed. Therefore, the barrier films having the configurations mentioned above can suppress the infiltration of oxygen and water vapor from the interface between the barrier film and the phosphor layer and suppress deterioration of the phosphor layer.

Hereinafter, the respective layers constituting the barrier film will be described in detail.

(Substrate)

The first and second substrates 11 and 21 are desirably a polymer film. Examples of materials for the polymer film include polyesters such as polyethylene terephthalate, polybutylene terephthalate, and polyethylene naphthalate; polyamides such as nylon; polyolefins such as polypropylene and cycloolefin; polycarbonates; and triacetyl cellulose, but the materials are not limited thereto. The polymer film is preferably a polyester film, a polyamide film, or a polyolefin film, more preferably a polyester film or a polyamide film, and further preferably a polyethylene terephthalate film. The polyethylene terephthalate film is desirable from the viewpoints of transparency, processing suitability, and adhesion. Furthermore, the polyethylene terephthalate film is preferably a biaxially stretched polyethylene terephthalate film from the viewpoints of transparency and gas barrier properties.

The polymer film may contain, as necessary, additives such as an antistatic agent, an ultraviolet absorber, a plasticizer, and a slipping agent. Furthermore, the surface of the polymer film may be subjected to surface treatment such as corona treatment, flame treatment, and plasma treatment.

In the barrier film, in a case where the first substrate 11 and the primer layer 5 are in contact with each other, the first substrate 11 preferably has a polar group such as a hydroxyl group on the surface. When the first substrate 11 has a polar group such as a hydroxyl group on the surface, adhesion is more improved by an intermolecular force between the polar group such as a hydroxyl group and the functional group in the primer layer 5. Among the aforementioned polymer films, usually, as a polymer film having a hydroxyl group on the surface, a polyethylene terephthalate film, a polybutylene terephthalate film, a polyethylene naphthalate film, a polycarbonate film, a cellulose triacetate film, and the like are exemplified. Furthermore, by performing surface treatment such as corona treatment, flame treatment, and plasma treatment, adhesion to the primer layer 5 can be more improved.

The thicknesses of the first and second substrates 11 and 21 are not particularly limited, and are preferably 3 μm or more and 100 μm or less and more preferably 5 μm or more and 50 μm or less. When this thickness is 3 μm or more, processing becomes easy, and when the thickness is 100 μm or less, the total thickness of the barrier film can be decreased.

(Anchor Coat Layer)

The anchor coat layers 12 and 22 are provided between the first and second substrates 11 and 21 and the inorganic thin film layers 13 and 23 so as to improve adhesion therebetween. Furthermore, the anchor coat layers 12 and 22 may have barrier properties for preventing the transmission of moisture and oxygen.

The anchor coat layers 12 and 22 can be formed by using, for example, a resin selected from a polyester resin, an isocyanate resin, a urethane resin, an acrylic resin, a polyvinyl alcohol resin, an ethylene vinyl alcohol resin, a vinyl-modified resin, an epoxy resin, an oxazoline group-containing resin, a modified styrene resin, a modified silicone resin, or an alkyl titanate. The anchor coat layers can be formed by using the aforementioned resin singly or as a composite resin obtained by combination of two or more kinds thereof.

The anchor coat layers 12 and 22 can be formed by coating a solution containing the aforementioned resin onto the first and second substrates 11 and 21 and drying and curing the solution. Examples of a coating method include coating methods using a gravure coater, a dip coater, a reverse coater, a wire bar coater, a die coater, and the like.

The thicknesses of the anchor coat layers 12 and 22 are preferably within a range of 5 to 500 nm and more preferably within a range of 10 to 100 nm. Herein, when the thickness is 5 nm or more, adhesion between the first and second substrates 11 and 21 and the inorganic thin film layers 13 and 23 and barrier properties against moisture and oxygen tend to be improved, and when the thickness is 500 nm or less, there is a tendency that a uniform layer whose internal stress is sufficiently suppressed can be formed.

(Barrier Layer)

The barrier layers 15 and 25 are layers which are provided to further improve a water vapor transmission rate and an oxygen transmission rate. The barrier layers 15 and 25 desirably have high transparency from the optical viewpoint. The barrier layers 15 and 25 may be a single layer or a multilayer, and desirably have the inorganic thin film layers 13 and 23 and the gas barrier coating layers 14 and 24 as illustrated in FIGS. 1 to 4.

The barrier layers 15 and 25 may be formed either in air or in vacuum. Examples of the vacuum film formation include a physical vapor deposition method and a chemical vapor deposition method. Examples of the physical vapor deposition method include a vacuum deposition method, a sputtering method, and an ion plating method. Examples of the chemical vapor deposition (CVD) method include a thermal CVD method, a plasma CVD (PECVD) method, and an optical CVD method. The film formation method may differ for the inorganic thin film layers 13 and 23 and the gas barrier coating layers 14 and 24.

(Inorganic Thin Film Layer)

The formation method of the inorganic thin film layers 13 and 23 is preferably a vacuum deposition method, a sputtering method or a PECVD method. In the vacuum deposition method, a resistance heating vacuum deposition method, an electron beam heating vacuum deposition method, and an induction heating vacuum deposition method are more preferred, and in the sputtering method, a reactive sputtering method and a dual magnetron sputtering method are more preferred. From the viewpoint of film homogeneity, the sputtering method is preferred, from the viewpoint of cost, the vacuum deposition method is preferred, and these methods can be selected depending on the purpose and use.

Examples of the plasma generation method in the sputtering method and the PECVD method include a direct current (DC) method, a radio frequency (RF) method, a middle frequency (MF) method, a DC pulse method, an RF pulse method, and a DC+RF superimposed method.

In the vacuum film formation, usually, films of metals, or of oxides, nitrides or nitride oxides of silicon or the like are formed. As the inorganic thin film layers 13 and 23, films of metals such as aluminum, titanium, copper, indium, and tin, or oxides thereof (such as alumina), or of silicon or silicon oxide are preferred. Furthermore, aside from the oxides of metals or silicon, films of nitrides or nitride oxides of the metals or silicon may be formed. Furthermore, films containing a plurality of metals may be formed. The aforementioned oxides, nitrides or nitride oxides of aluminum, titanium, copper, indium, and silicon are superior in both transparency and barrier properties. The oxides and nitride oxides containing silicon have high barrier properties, which are particularly preferred.

The thicknesses of the inorganic thin film layers 13 and 23 formed by vacuum film formation are preferably 5 nm or more and 100 nm or less. When the thicknesses of the inorganic thin film layers 13 and 23 are 5 nm or more, there is a tendency that more satisfactory barrier properties can be obtained. Furthermore, when the thicknesses of the inorganic thin film layers 13 and 23 are 100 nm or less, there is a tendency that occurrence of cracks is suppressed and lowering of the water vapor barrier properties and oxygen barrier properties due to the cracks can be suppressed. Further, when the thicknesses of the inorganic thin film layers 13 and 23 are 100 nm or less, cost reduction can be realized due to the reduction in amount of materials used, the shortage of a film formation time, and the like, which is preferred from economic viewpoint.

(Gas Barrier Coating Layer)

The gas barrier coating layers 14 and 24 are provided to prevent secondary various damages in subsequent steps and impart high barrier properties. The gas barrier coating layers 14 and 24 may contain a siloxane bond. The gas barrier coating layers 14 and 24 can also be formed in air. In a case where the gas barrier coating layers 14 and 24 are formed in air, the layers can be formed, for example, by coating, onto the inorganic thin film layers 13 and 23, a coating solution containing a compound having such polarity, as polyvinyl alcohol, polyvinylpyrrolidone, or ethylene vinyl alcohol, a compound containing chlorine such as polyvinylidene chloride, a compound containing a Si atom, a compound containing a Ti atom, a compound containing an Al atom, a compound containing a Zr atom, or the like, and drying and curing the coating solution.

Specific examples of the method of coating the coating solution when the gas barrier coating layers 14 and 24 are formed in air include coating methods using a gravure coater, a dip coater, a reverse coater, a wire bar coater, a die coater, and the like.

A compound containing a siloxane bond is preferably formed, for example, by using a silane compound to cause reaction with a silanol group to react. Examples of such a silane compound include a compound represented by the following Formula (1).

$$R^1_n(OR^2)_{4-n}Si \quad (1)$$

[In the formula, n represents an integer of 0 to 3, and $R^1$ and $R^2$ each independently represent a hydrocarbon group and preferably represent an alkyl group having 1 to 4 carbon atoms.]

Examples of the compound represented by the above Formula (1) include tetramethoxysilane, tetraethoxysilane, tetrapropoxysilane, tetrabutoxysilane, methyltrimethoxysilane, methyltriethoxysilane, dimethyldimethoxysilane, and dimethyldiethoxysilane. Polysilazane containing nitrogen may be used.

Furthermore, in the gas barrier coating layers 14 and 24, materials that are formed from precursors made of other metal atoms may be used. Examples of the compound containing a Ti atom include a compound represented by the following Formula (2).

$$R^1_n(OR^2)_{4-n}Ti \quad (2)$$

[In the formula, n represents an integer of 0 to 3, and $R^1$ and $R^2$ each independently represent a hydrocarbon group and preferably represent an alkyl group having 1 to 4 carbon atoms.]

Examples of the compound represented by the above Formula (2) include tetramethoxy titanium, tetraethoxy titanium, tetraisopropoxy titanium, and tetrabutoxy titanium.

Examples of the compound containing an Al atom include a compound represented by the following Formula (3).

$$R^1_m(OR^2)_{3-m}Al \quad (3)$$

[In the formula, m represents an integer of 0 to 2, and $R^1$ and $R^2$ each independently represent a hydrocarbon group and preferably represent an alkyl group having 1 to 4 carbon atoms.]

Examples of the compound represented by the above Formula (3) include trimethoxy aluminum, triethoxy aluminum, triisopropoxy aluminum, and tributoxy aluminum.

Examples of the compound containing a Zr atom include a compound represented by the following Formula (4).

$$R^1_n(OR^2)_{4-n}Zr \quad (4)$$

[In the formula, n represents an integer of 0 to 3, and $R^1$ and $R^2$ each independently represent a hydrocarbon group and preferably represent an alkyl group having 1 to 4 carbon atoms.]

Examples of the compound represented by the above Formula (4) include tetramethoxy zirconium, tetraethoxy zirconium, tetraisopropoxy zirconium, and tetrabutoxy zirconium.

In a case where the gas barrier coating layers 14 and 24 are formed in air, the above-described coating solution is cured after coating. The curing method is not particularly limited, and examples thereof include ultraviolet curing and heat curing. In the case of the ultraviolet curing, the coating solution may contain a polymerization initiator and a compound having a double bond. Furthermore, as necessary, thermal aging may be carried out.

As other methods of forming the gas barrier coating layers 14 and 24 in air, a method in which a reaction product, which is obtained by dehydration condensation of particles of an inorganic oxide of magnesium, calcium, zinc, aluminum, silicon, titanium, zirconium, or the like, through the phosphorus atom derived from a phosphorus compound, is formed as a gas barrier coating layer, can also be used. Specifically, the functional group (for example, a hydroxyl group) present on the surface of the inorganic oxide undergoes condensation reaction with the site of a phosphorus compound reactive with the inorganic oxide (for example, a halogen atom directly bound to the phosphorus atom or an oxygen atom directly bound to the phosphorus atom), thus causing binding therebetween. The reaction product can be obtained by coating a coating solution containing an inorganic oxide and a phosphorus compound onto the surface of the inorganic thin film layers 13 and 23 and subjecting the coating film thus formed to thermal treatment, thereby causing the particles of the inorganic oxide to undergo binding reaction through the phosphorus atom derived from the phosphorus compound. The lower limit of the temperature of the thermal treatment is 110° C. or higher, preferably 120° C. or higher, more preferably 140° C. or higher, and further preferably 170° C. or higher. When the thermal treatment temperature is low, a sufficient reaction speed is difficult to obtain, thereby causing the lowering of productivity. The preferred upper limit of the temperature of the thermal treatment differs depending on the type of the substrate, or the like, and is 220° C. or lower and preferably 190° C. or lower. The thermal treatment can be performed in air, under a nitrogen atmosphere, or under an argon atmosphere.

In a case where the gas barrier coating layers 14 and 24 are formed in air, the above-described coating solution may further contain a resin as long as coagulation or the like is not caused to occur. Specific examples of the above-described resin include an acrylic resin and a polyester resin. The above-described coating solution preferably contains a resin having high compatibility with other materials in the coating solution among these resins.

The above-described coating solution may further contain, as necessary, a filler, a levelling agent, a defoaming agent, an ultraviolet absorber, an antioxidant, a silane coupling agent, a titanium chelating agent, and the like.

The thicknesses of the gas barrier coating layers 14 and 24 formed in air are preferably 50 nm to 2000 nm and more preferably 100 nm to 1000 nm in terms of thickness after curing. When the thicknesses of the gas barrier coating layers 14 and 24 formed in air are 50 nm or more, film formation tends to become easy. When the thicknesses of the gas barrier coating layers 14 and 24 formed in air are 2000 nm or less, there is a tendency that cracking or curling can be suppressed.

(Adhesion Layer)

The adhesion layer 4 is provided between the first film 1 and the second film 2 so as to stack the first film 1 and the second film 2 by lamination as illustrated in FIG. 1 and FIGS. 3 and 4. As the adhesion layer 4, a layer that is generally used as an adhesive or pressure-sensitive adhesive for a polymer film can be used, and the adhesion layer 4 is appropriately selected depending on the lamination surfaces of the first film 1 and the second film 2. Examples of candidate materials for the adhesion layer 4 include epoxy-based, polyester-based, acrylic, rubber-based, phenol-based and urethane-based adhesives or pressure-sensitive adhesives.

Examples of the coating method of the adhesives or pressure-sensitive adhesives include coating methods using a gravure coater, a dip coater, a reverse coater, a wire bar coater, a die coater, and the like.

The thickness of the adhesion layer 4 is preferably 1 µm or more and 20 µm or less. When the thickness of the adhesion layer 4 is 1 µm or more, sufficient adhesion tends to be obtained, and when the thickness thereof is 20 µm or less, there is a tendency that the total thickness of the barrier film can be made thin and a cost rise can be suppressed.

Furthermore, after lamination of the first film 1 and the second film 2 through the adhesion layer 4, aging can be performed. The aging is performed, for example, at 20° C. to 80° C. for 1 to 10 days.

The adhesion layer 4 may contain, as necessary, a curing agent, an antistatic agent, a silane coupling agent, an ultraviolet absorber, an antioxidant, a levelling agent, a dispersing agent, and the like.

(Primer Layer)

The primer layer 5 is a layer that is provided for improving adhesion between the barrier film and the phosphor layer. The primer layer 5 is provided on the first substrate 11 of the first film 1 or on the gas barrier coating layer 14. The primer layer 5 is provided on one outermost surface of the barrier film, and the surface of the primer layer 5 side of the barrier film is laminated to the phosphor layer.

The primer layer 5 is a layer which is made of the cured product of the composition for forming a primer layer mentioned above. The primer layer 5 can be formed by coating the composition for forming a primer layer on the first substrate 11 of the first film 1 or on the gas barrier coating layer 14 and curing the composition. Examples of a coating method include coating methods using a gravure coater, a dip coater, a reverse coater, a wire bar coater, a die coater, and the like. The curing can be performed, for example, under conditions of 60° C. to 150° C. and 15 to 300 seconds. Furthermore, in order to more sufficiently cure the primer layer 5, the aging treatment may be performed at 40° C. to 80° C. for 1 to 7 days.

The thickness of the primer layer 5 is preferably 0.1 to 10 µm, more preferably 0.2 to 5 µm, further preferably 0.3 to 3 µm, and particularly preferably 0.5 to 1.5 µm. When this thickness is 0.1 µm or more, occurrence of pinholes can be suppressed and a sufficient film thickness is obtained, and thus stress relaxation properties can be sufficiently exhibited, film formability after coating is stabilized, and satisfactory adhesion can be uniformly obtained in the plane. On the other hand, when the thickness is 10 µm or less, the primer layer 5 is prevented from becoming brittle and stable adhesion to the phosphor layer can be obtained, the infiltration of moisture and oxygen from the edge (the area between the barrier film and the phosphor layer) of the primer layer 5 through the primer layer can be sufficiently suppressed, and deterioration of light-emitting properties (particularly, edge 25 deterioration) of the phosphor layer can be suppressed. Furthermore, a thinner primer layer 5 leads to a faster curing reaction of the primer layer 5 and also to better initial adhesion to the phosphor layer.

(Mat Layer)

The mat layer 6 is provided on the surface of the barrier film opposite to the primer layer 5 so as to exhibit one or more optical functions and antistatic functions. Herein, although not particularly limited, examples of the optical functions include an interference fringe (Moire) prevention function, an antireflective function, and a diffusion function. Of these, the mat layer 6 preferably has at least an interference fringe prevention function as an optical function. In the present embodiment, a case where the mat layer 6 has at least an interference fringe prevention function will be described.

The mat layer 6 may be configured by containing a binder resin and fine particles. Herein, the fine particles are embedded in the binder resin such that some of the fine particles are exposed from the surface of the mat layer 6, and thereby fine irregularities may be generated in the surface of the mat layer 6. When such a mat layer 6 is provided on the surface of the barrier film, the occurrence of an interference fringe such as Newton's ring can be more sufficiently prevented, and as a result, a wavelength conversion sheet having high efficiency, high precision and long life can be obtained.

The binder resin is not particularly limited, and a resin superior in optical transparency can be used. More specifically, for example, thermoplastic resins such as a polyester-based resin, an acrylic resin, an acrylic urethane-based resin, a polyester acrylate-based resin, a polyurethane acrylate-based resin, a urethane-based resin, an epoxy-based resin, a polycarbonate-based resin, a polyamide-based resin, a polyimide-based resin, a melamine-based resin, and a phenolic resin, thermosetting resins, ionizing radiation curing resins, and the like can be used. Furthermore, other than organic resins, a silica binder can also be used. Of there, it is desirable in view of a variety in type of materials to use an acrylic resin and a urethane-based resin, and it is more desirable in view of being superior in light resistance and optical characteristics to use an acrylic resin. These can be used singly or in combination of a plurality of types thereof.

The fine particles are not particularly limited, and for example, other than inorganic fine particles of silica, clay, talc, calcium carbonate, calcium sulfate, barium sulfate, titanium oxide, alumina, and the like, organic fine particles of a styrene resin, a urethane resin, a silicone resin, an acrylic resin, a polyamide resin, and the like can be used. Of these, as the fine particles, it is preferred in view of transmittance to use fine particles made of silica, an acrylic resin, a urethane resin, a polyamide resin, and the like and having a refractive index of 1.40 to 1.55. Fine particles whose refractive index is low are expensive; on the other hand, fine particles whose refractive index is too high tend to impair transmittance. These can be used singly or in combination of a plurality of types thereof.

The average particle diameter of the fine particles is preferably 0.1 to 30 μm and more preferably 0.5 to 10 μm. When the average particle diameter of the fine particles is 0.1 μm or more, a superior interference fringe prevention function tends to be obtained, and when the average particle diameter thereof is 30 μm or less, transparency tends to be more improved.

The content of the fine particles in the mat layer 6 is preferably 0.5 to 30% by mass and more preferably 3 to 10% by mass based on the total amount of the mat layer 6. When the content of the fine particles is 0.5% by mass or more, a light diffusion function and an effect of preventing occurrence of an interference fringe tend to be more improved, and when the content thereof is 30% by mass or less, the reduction of luminance does not occur.

The mat layer 6 can be formed by coating a coating solution containing the binder resin and the fine particles mentioned above onto the surface of the first film 1 or the second film 2 and drying and curing the coating solution. Examples of a coating method include coating methods using a gravure coater, a dip coater, a reverse coater, a wire bar coater, a die coater, and the like.

The thickness of the mat layer 6 is preferably 0.1 to 20 μm and more preferably 0.3 to 10 μm. When the thickness of the mat layer 6 is 0.1 μm or more, there is a tendency that a uniform film is likely to be obtained and an optical function is likely to be sufficiently obtained. On the other hand, when the thickness of the mat layer 6 is 20 μm or less, in the case of using the fine particles in the mat layer 6, there is a tendency that the fine particles are exposed on the surface of the mat layer 6 and an irregularity-imparting effect is likely to be obtained.

The barrier film of the present embodiment having the configuration described above can be used for applications that require barrier properties concerning the transmission of oxygen and water vapor, and for example, the barrier film of the present embodiment can be used as a barrier film of a wavelength conversion sheet including a phosphor used for liquid crystal backlight, particularly a wavelength conversion sheet including a quantum dot phosphor.

[Wavelength Conversion Sheet]

Figure 5:
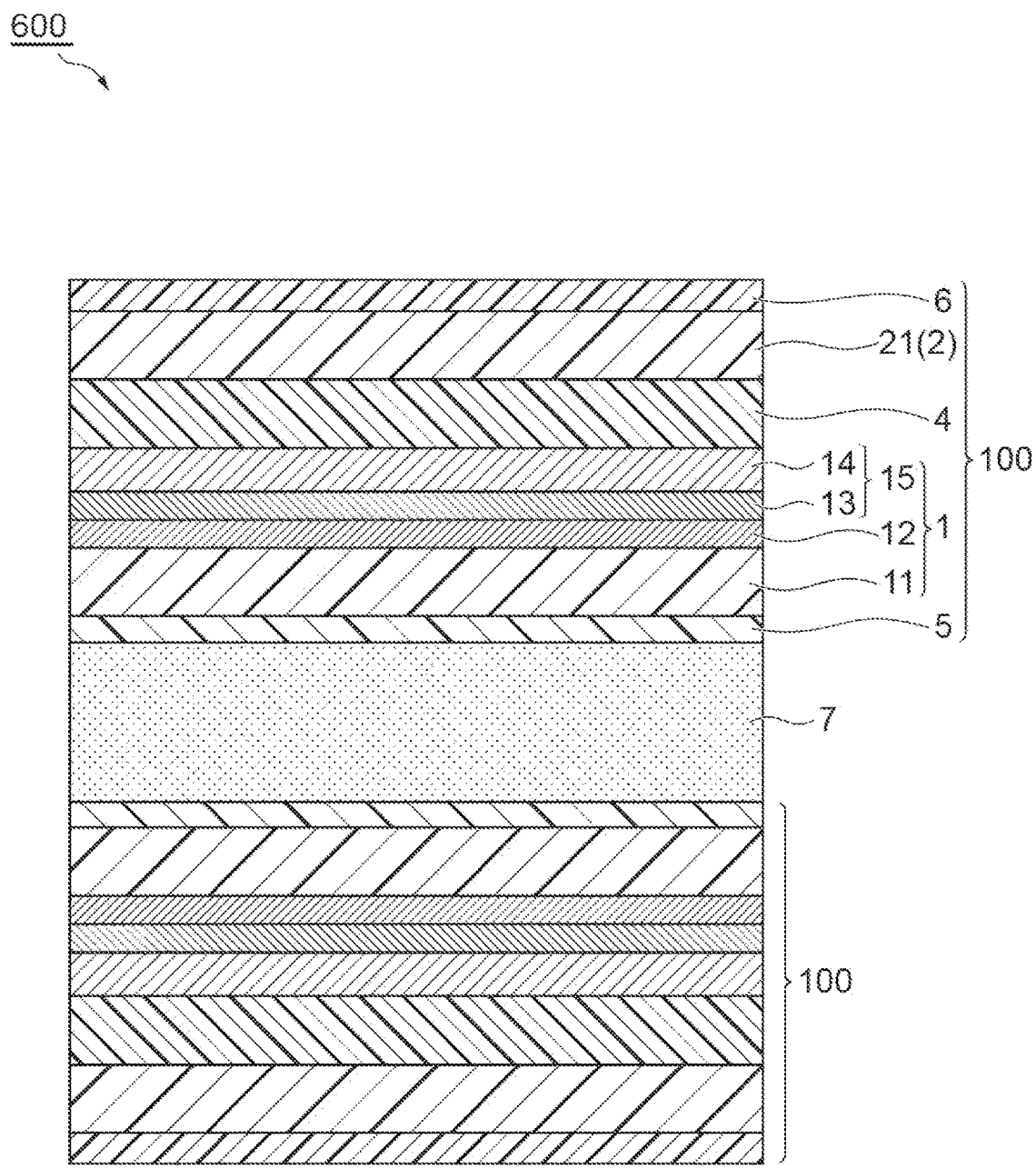
FIG. 5 is a schematic cross-sectional view illustrating an embodiment of a wavelength conversion sheet of the present disclosure.

Next, the wavelength conversion sheet of the present disclosure using the above-described barrier film will be described. The wavelength conversion sheet of the present disclosure includes a phosphor layer containing a phosphor and the barrier film of the present disclosure stacked on at least one surface of the phosphor layer, in which the barrier film includes the primer layer on an outermost surface of the phosphor layer side. FIG. 5 is a schematic cross-sectional view illustrating an embodiment of a wavelength conversion sheet of the present disclosure. A wavelength conversion sheet 600 illustrated in FIG. 5 has a structure in which a phosphor layer 7 containing a phosphor and having a wavelength conversion function is sandwiched between a pair of barrier films 100. The pair of barrier films 100 and the phosphor layer 7 are stacked so that the primer layer 5 is in contact with the phosphor layer 7. In the wavelength conversion sheet 600 having such a configuration, since the barrier film 100 and the phosphor layer 7 are laminated through the primer layer 5, superior adhesion is obtained. Incidentally, the barrier film 100 may be the barrier film 200, the barrier film 300, or the barrier film 400 mentioned above.

(Phosphor Layer)

The phosphor layer 7 is a layer having a wavelength conversion function enabling the emission of light having a different wavelength depending on the irradiation of excited light and contains at least one or more types of phosphor (not illustrated).

A nano-sized semiconductor called quantum dots among phosphors is preferred since a high wavelength conversion efficiency is obtained and luminance and color reproducibility as a display are superior. Examples of the quantum dots include those in which a core serving as a light-emitting portion is covered with a shell serving as a protective film. Examples of the core include cadmium selenide (CdSe), and examples of the shell include zinc sulfide (ZnS). When the surface defects of the CdSe particles are covered with ZnS having a large band gap, the quantum efficiency is improved. Furthermore, the phosphor may be a phosphor in which a core is doubly covered with a first shell and a second shell. In this case, CdSe can be used as the core, zinc selenide (ZnSe) can be used as the first shell, and ZnS can be used as the second shell. The phosphors are used in combination of two or more types thereof. Furthermore, a phosphor layer containing one type of phosphor alone and another phosphor layer containing other type of phosphor alone may be stacked.

The phosphor is dispersed in a sealing resin for sealing. The sealing resin can be formed, for example, by using a curable resin such as a light (UV) curable resin having an ethylenical double bond, an epoxy-based photo cation polymerizable resin, an epoxy-amine-based thermosetting resin, or a urethane curable thermosetting resin.

The phosphor layer 7 can be formed by coating a mixed solution containing a phosphor, a curable resin, as necessary, a curing agent, and as necessary, a solvent onto the primer layer 5 of the barrier film to form a coating film, and as necessary, stacking one separately prepared barrier film such that the primer layer 5 faces the phosphor layer 7, followed by curing the coating film.

The curing of the coating film can be appropriately performed depending on a curable resin to be used. For example, in a case where the curable resin is a thermosetting resin, the curing can be performed by heating or aging. On the other hand, in a case where the curable resin is a photocurable resin, the curing of the coating film can be performed by curing (UV curing) the photocurable resin with irradiation of ultraviolet light. Incidentally, the photocurable resin may be further thermally cured after the UV curing. The curable resin is cured, and thereby the sealing resin of the phosphor layer 7 is formed.

The wavelength conversion sheet of the present embodiment mentioned above can be used, for example, in a backlight unit. The backlight unit includes, for example, a light source, a light guide plate, a reflection plate, and the wavelength conversion sheet of the present embodiment. In the backlight unit, the light guide plate and the reflection plate are disposed on one surface of the wavelength conversion sheet in this order, and the light source is disposed in a lateral direction of the light guide plate (in the surface direction of the light guide plate). As the light source, for example, a blue light emitting diode element or the like is used.

[Methods for Producing Barrier Film and Wavelength Conversion Sheet]

Next, embodiments of methods for producing the barrier film and the wavelength conversion sheet of the present disclosure will be described. The method for producing the barrier film of the present embodiment is a method for producing a barrier film including: a gas barrier film; and a primer layer disposed on one outermost surface of the barrier film, and includes a step of coating the composition for forming a primer layer onto the gas barrier film and curing the composition to form the primer layer. Furthermore, the method for producing the wavelength conversion sheet of the present embodiment is a method for producing a wavelength conversion sheet including a phosphor layer containing a phosphor and a cured product (sealing resin) of a curable resin and a barrier film stacked on at least one surface of the phosphor layer and having a primer layer on an outermost surface of the phosphor layer side, and includes a step of coating a composition for forming a phosphor layer containing a phosphor and a curable resin onto the primer layer of the barrier film to form a coating film and a step of curing the curable resin in the coating film to form a phosphor layer. In the present embodiment, the surface of the gas barrier film on which the primer layer is formed is the first substrate 11 in the barrier films 100 and 300 illustrated in FIGS. 1 and 3 and the gas barrier coating layer 14 in the barrier films 200 and 400 illustrated in FIGS. 2 and 4.

In a case where the barrier film 100 illustrated in FIG. 1 and the wavelength conversion sheet 600 illustrated in FIG. 5 using the barrier film 100 are produced, for example, they can be produced by the following procedure. Incidentally, the methods of forming the respective layers are as mentioned above. First, the first film 1 and the second film 2 are respectively prepared. That is, the anchor coat layer 12 is formed on the first substrate 11, the inorganic thin film layer 13 and the gas barrier coating layer 14 are sequentially formed thereon, and thereby the first film 1 is prepared. As the second film 2, the second substrate 21 is used without any changes.

An adhesive or pressure-sensitive adhesive is coated onto the gas barrier coating layer 14 of the first film 1 thus obtained, and laminated with the second film 2, followed by aging to obtain a laminate film in which the first film 1 and the second film 2 are laminated through the adhesion layer 4. The lamination can be performed by using a general lamination apparatus. Incidentally, the adhesive or pressure-sensitive adhesive may be coated onto the second film 2.

The composition for forming a primer layer of the present embodiment mentioned above is coated onto the first substrate 11 of the laminate film thus obtained and is cured to form the primer layer 5. Furthermore, the mat layer 6 is formed on the second film 2 of the laminate film. The formation order of the primer layer 5 and the mat layer 6 is not particularly limited. Furthermore, the mat layer 6 may be formed on the second film 2 in advance before lamination between the first film 1 and the second film 2. Further, the primer layer 5 may be formed on the first substrate 11 of the first film 1 in advance before lamination between the first film 1 and the second film 2. Thereby, the barrier film 100 is obtained. Two barrier films 100 are prepared.

Next, a mixed solution containing a phosphor, a curable resin, as necessary, a curing agent, and as necessary, a solvent is coated onto the primer layer 5 of one of the barrier films 100 to form a coating film, the primer layer 5 side of the other of the barrier films 100 is laminated thereonto, and the coating film is cured to form the phosphor layer 7.

According to the method described above, the wavelength conversion sheet 600 of the present embodiment having satisfactory gas barrier properties and having superior adhesion between the barrier film 100 and the phosphor layer 7 can be obtained.

Hereinbefore, although the preferred embodiments of the present disclosure have been described in detail, the technical scope of the present disclosure is not limited to the above-described embodiments, and various alterations may be added within the range not departing from the spirit of the present disclosure.

For example, in the barrier films illustrated in FIGS. 1 to 5, the mat layer 6 and the anchor coat layers 12 and 22 may not be provided.

In the barrier films illustrated in FIGS. 1 to 5, the barrier layers 15 and 25 may be layers in which the inorganic thin film layers 13 and 23 and the gas barrier coating layers 14 and 24 are alternately and plurally stacked. In this case, gas barrier properties can be more enhanced.

In the barrier films illustrated in FIGS. 1 to 5, the directions of the first film 1 and the second film 2 are not limited to directions illustrated in the drawings, and these films may be disposed in opposite directions.

The barrier film may further have, in addition to the first film and the second film, one or more films having the same configuration as those of the films.

In the barrier film illustrated in FIG. 1, the second film 2 and the adhesion layer 4 may not be provided. In the barrier film illustrated in FIG. 2, the second film 2 consisting of only the second substrate 21, which is attached to the first substrate 11 through the adhesion layer 4, may be provided between the mat layer 6 and the first substrate 11.

In the wavelength conversion sheet illustrated in FIG. 5, the pair of barrier films sandwiching the phosphor layer 7 may have mutually different configurations. Furthermore, the mat layer 6 may not necessarily be provided on the both surfaces of the wavelength conversion sheet, and may be provided only on one surface.

EXAMPLES

Hereinafter, the present disclosure will be described in more detail on the basis of Examples and Comparative Examples; however, the present disclosure is not limited to the following Examples.

Example 1

(Preparation of Composition for Forming Primer Layer)

200 parts by mass of a solvent (ethyl acetate) was added to 50 parts by mass of an acryloyl group-containing resin (manufactured by ARAKAWA CHEMICAL INDUSTRIES, LTD., Model No.: ACS-719, a resin having an acryloyl group and a secondary hydroxyl group, (meth)acrylic equivalent: 214 g/eq, hydroxyl value: 262 mgKOH/g) as the resin having a reactive carbon-carbon double bond and 50 parts by mass of acrylic polyol (manufactured by ARAKAWA CHEMICAL INDUSTRIES, LTD., Model No.: ACS-717, hydroxyl value: 80 mgKOH/g) as the resin not having a reactive carbon-carbon double bond but having a primary hydroxyl group and was stirred at 25° C. for 2 hours. Thereafter, 23 parts by mass of biuret type hexamethylene diisocyanate (manufactured by ARAKAWA CHEMICAL INDUSTRIES, LTD., trade name: ARACOAT CL106) was added as the curing agent thereto and stirred at 25° C. for 30 minutes, thereby obtaining a composition for forming a primer layer.

The (meth)acrylic equivalent and the hydroxyl value of the whole resin components excluding the polyisocyanate compound and the solvent in the composition for forming a primer layer were obtained by the following methods. The (meth)acrylic equivalent was obtained by calculation from the (meth)acrylic equivalent of the resin having a reactive carbon-carbon double bond and the blending ratio thereof. The hydroxyl value was obtained by calculation from the hydroxyl value of the resin having a reactive carbon-carbon double bond, the hydroxyl value of the resin not having a reactive carbon-carbon double bond but having a primary hydroxyl group, and the blending ratio thereof.

(Preparation of Barrier Film)

A polyester resin solution was coated, by a bar coating method, onto a corona discharge-treated surface of a biaxially stretched polyethylene terephthalate film (trade name: P60, thickness: 16 μm, manufactured by TORAY INDUSTRIES, INC.) whose one surface had been treated with corona discharge, followed by drying and curing at 80° C. for 1 minute to form an anchor coat layer having a thickness of 100 nm.

Using a vacuum deposition apparatus of an electron beam heating type, a silicon oxide material (manufactured by Canon Optron, Inc.) was evaporated by heating with an electron beam under a pressure of $1.5 \times 10^{-2}$ Pa to form a SiOx film having a thickness of 80 nm as an inorganic thin film layer on the anchor coat layer. Incidentally, the acceleration voltage in the deposition was 40 kV and the emission current was 0.2 A. A coating solution obtained by mixing a hydrolyzate of tetraethoxysilane (containing a siloxane bond) and polyvinyl alcohol at a mass ratio of 1:1 was coated onto this SiOx film by a bar coating method, and dried and cured at 120° C. for 1 minute to form a gas barrier coating layer having a thickness of 400 nm. Thereby, a first film was obtained. The water vapor transmission rate of the first film was 0.5 g/(m²·day).

An adhesive (main agent: TAKELAC A525, curing agent: TAKENATE A50, manufactured by Mitsui Chemicals, Inc.) was coated onto the gas barrier coating layer of the first film to obtain an adhesion layer, and a corona discharge-treated surface of a biaxially stretched polyethylene terephthalate film (trade name: FE2001, thickness: 25 μm, manufactured by Futamura Chemical Co., Ltd., water vapor transmission rate: 25 g/(m²·day)) as the second film was laminated therewith, and aging was performed at 40° C. for 2 days. Thereby, a laminate film (1) in which the first film and the second film were laminated through the adhesion layer was obtained. The thickness of the adhesion layer was 4 μm.

The composition for forming a primer layer was coated, by a wire bar coater, onto the polyethylene terephthalate film (first substrate) of the first film in the laminate film (1) thus obtained to form a coating film, and aging was performed at 40° C. for 3 days after drying and curing at 100° C. for 20 seconds by a batch oven, thereby forming a primer layer. The thickness of the primer layer was 1 μm.

Furthermore, a composition for forming a mat layer composed of 100 parts by mass of an acrylic polyol resin (manufactured by DIC Corporation, trade name: ACRYDIC A-814), 8.5 parts by mass of an isocyanate-based curing agent (manufactured by DIC Corporation, trade name: BURNOCK DN-980, hexamethylene diisocyanate-based compound), 10 parts by mass of fine particles (polyurethane, average particle diameter: 2 μm), and 70 parts by mass of a solvent (ethyl acetate) was coated onto the polyethylene terephthalate film (second substrate) of the second film and cured by heating and drying, thereby forming a mat layer having a thickness of 3 μm. Thereby, a barrier film having a configuration illustrated in FIG. 1 was obtained. Two barrier films were prepared.

(Preparation of Wavelength Conversion Sheet)

A composition for forming a phosphor layer containing a quantum dot phosphor, which includes cadmium selenide (CdSe) as a core and zinc sulfide (ZnS) as a shell and has a particle diameter of 6 nm, an acrylic photocurable resin (manufactured by Hitachi Chemical Co., Ltd., trade name: Hitalloid 7927-8) having an acryloyl group at the terminal of the main chain or side chain, and a photopolymerization initiator (manufactured by BASF SE, trade name: Irgacure 907) was coated on the primer layer of one of the barrier films to form a coating film, and the primer layer of the other of the barrier films was laminated thereto. The coating film was cured by exposure to light at an exposure amount of 300 mJ/cm² by using an ultraviolet irradiation device, thereby forming a phosphor layer (thickness: 100 μm) having a wavelength conversion function. Thereby, a wavelength conversion sheet was obtained.

Examples 2 to 8 and 13 and Comparative Examples 1 to 4

A composition for forming a primer layer, a barrier film, and a wavelength conversion sheet were obtained in the same manner as in Example 1, except that the blending amount of the resin and the type and blending amount of the curing agent in the composition for forming a primer layer were changed as shown in Table 1. Incidentally, in Example 13, isocyanurate type hexamethylene diisocyanate (manufactured by ARAKAWA CHEMICAL INDUSTRIES, LTD., trade name: ARACOAT CL2503) was used as the curing agent. Furthermore, in Table 1, the resin having a reactive carbon-carbon double bond is referred to as "C=C-containing resin", the resin not having a reactive carbon-carbon double bond but having a primary hydroxyl group is referred to as "OH-containing resin", the biuret type hexamethylene diisocyanate is referred to as "HDI-bi", the isocyanurate type hexamethylene diisocyanate is referred to as "HDI-nu", and the unit of the blending amount thereof is "parts by mass".

Example 9

A composition for forming a primer layer and two barrier films were obtained in the same manner as in Example 1. A composition for forming a phosphor layer containing a quantum dot phosphor, which includes cadmium selenide (CdSe) as a core and zinc sulfide (ZnS) as a shell and has a particle diameter of 6 nm, an epoxy resin (manufactured by ADEKA Corporation, trade name: ADEKA RESIN EP-4088S), and a polyamine-based curing agent (manufactured by ADEKA Corporation, trade name: ADEKA HARDENER EH-5015S) was coated on the primer layer of one of the barrier films to form a coating film, and the primer layer of the other of the barrier films was laminated thereto. The coating film was cured by performing curing at 100° C. for 10 minutes, thereby forming a phosphor layer (thickness: 100 μm) having a wavelength conversion function. Thereby, a wavelength conversion sheet was obtained.

Example 10

A composition for forming a primer layer, a barrier film, and a wavelength conversion sheet were obtained in the same manner as in Example 9, except that the blending amount of the resin and the type and blending amount of the curing agent in the composition for forming a primer layer were changed as shown in Table 1.

Example 11

A composition for forming a primer layer and two barrier films were obtained in the same manner as in Example 1. A composition for forming a phosphor layer containing a quantum dot phosphor, which includes cadmium selenide (CdSe) as a core and zinc sulfide (ZnS) as a shell and has a particle diameter of 6 nm, OLESTER Q612 manufactured by Mitsui Chemicals, Inc. (trade name, acrylic polyol), and TAKENATE D-165N manufactured by Mitsui Chemicals, Inc. (trade name, polyisocyanate) was coated on the primer layer of one of the barrier films to form a coating film, and the primer layer of the other of the barrier films was laminated thereto. The coating film was cured by performing curing at 100° C. for 10 minutes, thereby forming a phosphor layer (thickness: 100 μm) having a wavelength conversion function. Thereby, a wavelength conversion sheet was obtained.

Example 12

A composition for forming a primer layer, a barrier film, and a wavelength conversion sheet were obtained in the same manner as in Example 11, except that the blending amount of the resin and the type and blending amount of the curing agent in the composition for forming a primer layer were changed as shown in Table 1.

Example 14

A composition for forming a primer layer and a first film were obtained in the same manner as in Example 1. The composition for forming a primer layer was coated, by a wire bar coater, onto the gas barrier coating layer of the first film thus obtained to form a coating film, and the coating film was cured by performing aging at 40° C. for 3 days after being dried at 100° C. for 20 seconds by a batch oven, thereby forming a primer layer. The thickness of the primer layer was 1 μm.

Furthermore, a mat layer having a thickness of 3 μm was formed on the polyethylene terephthalate film (first substrate) of the first film in the same manner as in Example 1. Thereby, a barrier film having a configuration illustrated in FIG. 2 was obtained. Two barrier films were prepared. A wavelength conversion sheet was obtained in the same manner as in Example 1, except that these two barrier films were used.

Example 15

A composition for forming a primer layer, a barrier film, and a wavelength conversion sheet were obtained in the same manner as in Example 1, except that 5 parts by mass of a photopolymerization initiator (manufactured by BASF SE, trade name: Irgacure 907) was added to the composition for forming a primer layer. The photopolymerization initiator was added along with the curing agent at the time of adding the curing agent.

Example 16

A composition for forming a primer layer, a barrier film, and a wavelength conversion sheet were obtained in the same manner as in Example 1, except that 3 parts by mass of a thermosetting catalyst (manufactured by Matsumoto Fine Chemical Co., Ltd., trade name: ORGATIX ZC-150, zirconium tetra acetylacetonate) was added to the composition for forming a primer layer, and the coating film formed by coating the composition for forming a phosphor layer was cured by exposure to light at an exposure amount of 300 mJ/cm$^2$ by using an ultraviolet irradiation device and then further curing at 100° C. for 10 minutes at the time of preparing a wavelength conversion sheet. The thermosetting catalyst was added along with the curing agent at the time of adding the curing agent.

Example 17

A composition for forming a primer layer, a barrier film, and a wavelength conversion sheet were obtained in the same manner as in Example 1, except that 5 parts by mass of a photopolymerization initiator (manufactured by BASF SE, trade name: Irgacure 907) and 3 parts by mass of a thermosetting catalyst (manufactured by Matsumoto Fine Chemical Co., Ltd., trade name: ORGATIX ZC-150, zirconium tetra acetylacetonate) were added to the composition for forming a primer layer, and the coating film formed by coating the composition for forming a phosphor layer was cured by exposure to light at an exposure amount of 300 mJ/cm$^2$ by using an ultraviolet irradiation device and then further curing at 100° C. for 10 minutes at the time of preparing a wavelength conversion sheet. The photopolymerization initiator and the thermosetting catalyst were added along with the curing agent at the time of adding the curing agent.

<Measurement of Wetting Index>

A wetting reagent (manufactured by Wako Pure Chemical Industries, Ltd., trade name: Wetting Tension Test Mixture) was applied to a cotton swab, spread on the primer layer of the barrier film prepared in Examples and Comparative Examples to form a liquid film, and then a case where the liquid film maintained a film state without being torn at the time point of elapse of 2 seconds was determined to be a wetted state. The largest value of the surface tension of a wetting reagent that had been determined to be wetted by this method was considered as the wetting index of the primer layer. Results are shown in Table 1.

<Evaluation of Adhesion>

The wavelength conversion sheets obtained in Examples and Comparative Examples were cut into a 1 cm wide strip, and the cut wavelength conversion sheets were fixed onto a glass plate. The barrier film of the fixed strip-shaped wavelength conversion sheet was peeled off from the phosphor layer by using a Tensilon universal testing machine (manufactured by A&D Company, Limited) at a speed of 300 mm/min in a direction vertical to the glass plate to measure a force required for the peeling as the peeling strength. Furthermore, assuming a case where the barrier film is left under a high-temperature high-humidity environment for a long time, as a reliability test, the wavelength conversion sheets obtained in Examples and Comparative Examples were maintained at 65° C. and 95% RH for 500 hours. The peeling strength was measured by using the wavelength conversion sheets after the reliability test according to the same method. The peeling strength can be said to be satisfactory as long as it is 3.0 N/cm or more. Measurement results of the peeling strength before and after the reliability test are shown in Table 1.

<Evaluation of Edge Deterioration>

For the wavelength conversion sheets after the reliability test, which had been prepared in the evaluation of adhesion, presence or absence of deterioration of the phosphor layer from the sheet edge was evaluated by the following method. That is, blue LED light was applied from one of the barrier film sides of the wavelength conversion sheet after the reliability test, transmitted light was visually observed from the other barrier film, and the maximum value of the width of a part, which did not emit light due to deterioration of the phosphor layer, in the sheet edge from the sheet edge was measured. A case where the width of the edge deterioration is 3 mm or less, it can be said that deterioration is sufficiently suppressed. Results are shown in Table 1. Incidentally, "≤1" in Table 1 also includes a case where there is no edge deterioration.

TABLE 1

| | C=C-containing resin | OH-containing resin | Curing agent HDI-bi | Curing agent HDI-nu | Wetting index (dyn/cm) | NCO/OH ratio | (Meth)acrylic equivalent (g/eq) |
|---|---|---|---|---|---|---|---|
| Example 1 | 50 | 50 | 23.0 | — | 46 | 0.48 | 428 |
| Example 2 | 50 | 50 | 12.5 | — | 48 | 0.24 | 428 |
| Example 3 | 50 | 50 | 46.0 | — | 42 | 0.96 | 428 |
| Example 4 | 25 | 75 | 23.0 | — | 42 | 0.65 | 856 |
| Example 5 | 75 | 25 | 23.0 | — | 42 | 0.38 | 285 |
| Example 6 | 75 | 25 | 12.5 | — | 42 | 0.19 | 285 |
| Example 7 | 85 | 15 | 12.5 | — | 40 | 0.18 | 252 |
| Example 8 | 50 | 50 | 4.0 | — | 48 | 0.08 | 428 |
| Example 9 | 50 | 50 | 23.0 | — | 46 | 0.48 | 428 |
| Example 10 | 75 | 25 | 23.0 | — | 42 | 0.38 | 285 |
| Example 11 | 50 | 50 | 23.0 | — | 46 | 0.48 | 428 |
| Example 12 | 75 | 25 | 23.0 | — | 42 | 0.38 | 285 |
| Example 13 | 75 | 25 | — | 23 | 42 | 0.34 | 285 |
| Example 14 | 50 | 50 | 23.0 | — | 46 | 0.48 | 428 |
| Example 15 | 50 | 50 | 23.0 | — | 46 | 0.48 | 428 |
| Example 16 | 50 | 50 | 23.0 | — | 46 | 0.48 | 428 |
| Example 17 | 50 | 50 | 23.0 | — | 46 | 0.48 | 428 |
| Comparative Example 1 | 90 | 10 | 12.5 | — | 38 | 0.17 | 238 |
| Comparative Example 2 | — | 100 | 23 | — | 46 | 1.03 | — |
| Comparative Example 3 | 100 | — | 23 | — | 36 | 0.31 | 214 |
| Comparative Example 4 | 75 | 25 | — | — | 42 | 0.00 | 285 |

| | Hydroxyl value (mgKOH/g) | QD resin | QD resin curing method | Peeling strength (N/cm) Before reliability test | Peeling strength (N/cm) After reliability test | Edge deterioration (mm) |
|---|---|---|---|---|---|---|
| Example 1 | 171 | Acrylic | UV | 6.2 | 6.5 | ≤1 |
| Example 2 | 171 | Acrylic | UV | 6.1 | 6.4 | ≤1 |
| Example 3 | 171 | Acrylic | UV | 4.0 | 4.8 | ≤1 |
| Example 4 | 125.5 | Acrylic | UV | 3.3 | 3.5 | ≤1 |
| Example 5 | 216.5 | Acrylic | UV | 6.8 | 6.8 | ≤1 |
| Example 6 | 216.5 | Acrylic | UV | 6.5 | 6.2 | ≤1 |
| Example 7 | 235 | Acrylic | UV | 3.5 | 3.2 | 2 |
| Example 8 | 171 | Acrylic | UV | 6.0 | 3.6 | 3 |
| Example 9 | 171 | Epoxy/amine | Heat | 5.8 | 5.9 | ≤1 |
| Example 10 | 216.5 | Epoxy/amine | Heat | 5.5 | 5.4 | ≤1 |
| Example 11 | 171 | Acrylic polyol/isocyanate | Heat | 6.4 | 6.0 | ≤1 |
| Example 12 | 216.5 | Acrylic polyol/isocyanate | Heat | 6.1 | 5.8 | ≤1 |
| Example 13 | 216.5 | Acrylic | UV | 6.5 | 6.6 | ≤1 |
| Example 14 | 171 | Acrylic | UV | 7.1 | 6.8 | ≤1 |
| Example 15 | 171 | Acrylic | UV | 7.3 | 6.9 | ≤1 |
| Example 16 | 171 | Acrylic | UV and heat | 7.0 | 6.7 | ≤1 |
| Example 17 | 171 | Acrylic | UV and heat | 7.2 | 6.8 | ≤1 |
| Comparative Example 1 | 244 | Acrylic | UV | 2.5 | 1.5 | 4 |
| Comparative Example 2 | 80 | Acrylic | UV | 1.2 | 1.1 | 5 |
| Comparative Example 3 | 262 | Acrylic | UV | 0.8 | 0.7 | 5 |
| Comparative Example 4 | 216.5 | Acrylic | UV | 2.5 | 0.3 | 6 |

REFERENCE SIGNS LIST

1: first film, 2: second film, 4: adhesion layer, 5: primer layer, 6: mat layer, 7: phosphor layer, 11: first substrate, 21: second substrate, 12, 22: anchor coat layer, 13, 23: inorganic thin film layer, 14, 24: gas barrier coating layer, 15, 25: barrier layer, 100, 200, 300, 400: barrier film, 600: wavelength conversion sheet.

The invention claimed is:

1. A barrier film comprising:
a gas barrier film including a substrate and a barrier layer; and
a primer layer disposed on one outermost surface of the barrier film and made of a cured product formed from a composition to form the primer layer,
the composition containing:
a resin having a reactive carbon-carbon double bond, the resin having a reactive carbon-carbon double bond is a resin having an acryloyl group, a hydroxyl group, and a hydroxyl value of 100-300 mgKOH/g,
a resin not having a reactive carbon-carbon double bond but having a primary hydroxyl group, and
a polyisocyanate compound,
wherein the primer layer has a surface wetting index of 40 dyn/cm or more.

2. The barrier film according to claim 1, wherein an NCO/OH ratio of the composition for forming a primer layer is 0.1 to 0.6.

3. The barrier film according to claim 1, wherein a (meth)acrylic equivalent of components of the resin contained in the composition for forming a primer layer is 270 to 800 g/eq.

4. The barrier film according to claim 1, wherein a hydroxyl value of components of the resin contained in the composition for forming a primer layer is 150 to 230 mgKOH/g.

5. A wavelength conversion sheet comprising:
a phosphor layer containing a phosphor and a cured product of a curable resin; and
the barrier film according to claim 1 stacked on at least one surface of the phosphor layer, wherein
the primer layer of the barrier film is in contact with the at least one surface of the phosphor layer.

6. A method for producing a wavelength conversion sheet, the method comprising:
coating a composition for forming a phosphor layer containing a phosphor and a curable resin on a primer layer of a barrier film to form a coated film,
the barrier film including:
a gas barrier film including a substrate and a barrier layer, and
the primer layer disposed on one outermost surface of the barrier film and made of a cured product formed from a composition to form the primer layer,
the composition containing:
a resin having a reactive carbon-carbon double bond, the resin having a reactive carbon-carbon double bond is a resin having an acryloyl group, a hydroxyl group, and a hydroxyl value of 100-300 mgKOH/g,
a resin not having a reactive carbon-carbon double bond but having a primary hydroxyl group, and
a polyisocyanate compound,
wherein the primer layer has a surface wetting index of 40 dyn/cm or more; and
curing the curable resin in the coated film to form a phosphor layer.

* * * * *